(12) United States Patent
Branchevsky

(10) Patent No.: US 6,778,058 B1
(45) Date of Patent: Aug. 17, 2004

(54) EMBEDDED 3D COIL INDUCTORS IN A LOW TEMPERATURE, CO-FIRED CERAMIC SUBSTRATE

(75) Inventor: Shaul Branchevsky, Mission Viejo, CA (US)

(73) Assignee: National Semiconductor Corporation, Santa Clara, CA (US)

(*) Notice: Subject to any disclaimer, the term of this patent is extended or adjusted under 35 U.S.C. 154(b) by 166 days.

(21) Appl. No.: 10/006,482

(22) Filed: Dec. 6, 2001

Related U.S. Application Data

(63) Continuation-in-part of application No. 09/632,361, filed on Aug. 3, 2000, now Pat. No. 6,470,545, which is a continuation-in-part of application No. 09/396,151, filed on Sep. 15, 1999, now Pat. No. 6,252,761.

(51) Int. Cl.[7] .................................................. H01F 5/00
(52) U.S. Cl. ....................................................... 336/200
(58) Field of Search ........................... 336/83, 65, 200, 336/206–208, 221–223, 232; 361/795

(56) References Cited

U.S. PATENT DOCUMENTS

| | | | |
|---|---|---|---|
| 4,082,906 A | 4/1978 | Amin et al. | 428/539 |
| 4,471,406 A | 9/1984 | Sawairi | 361/328 |
| 4,517,406 A | 5/1985 | Erdle | 174/72 |
| 4,734,818 A | 3/1988 | Hernandez et al. | 361/306 |
| 4,740,863 A | 4/1988 | Langlois | 361/309 |
| 4,748,537 A | 5/1988 | Hernandez et al. | 361/306 |
| 5,027,253 A | 6/1991 | Lauffer et al. | 361/321 |
| 5,036,424 A | 7/1991 | Yokotani et al. | 361/321 |
| 5,046,236 A | 9/1991 | Wada et al. | 29/610.1 |
| 5,319,517 A | 6/1994 | Nomura et al. | 361/321.4 |
| 5,661,882 A | 9/1997 | Alexander | 29/25.42 |
| 5,687,055 A | 11/1997 | Miki | 361/305 |
| 5,736,448 A | 4/1998 | Saia et al. | 438/393 |
| 6,011,683 A | 1/2000 | Dat | 361/306.1 |
| 6,061,228 A | 5/2000 | Palmer et al. | 361/306.2 |
| 6,252,761 B1 | 6/2001 | Branchevsky | 361/321.2 |
| 6,384,706 B1 * | 5/2002 | Iwanami | 336/200 |

OTHER PUBLICATIONS

Delaney, *Characterization and Performance Prediction for Integral Capacitors in Low Temperature Co–Fired Ceramic Technology*, IEEE Transactions on Advanced Packaging, vol. 22, No. 1, Feb. 1999, p. 68–77.

Delaney, *Characterisation of the Electrical Performance of Buried Capacitors and Resistors in Low Temperature Co–Fired (LTCC) Ceramic*, IEEE Electronic Components and Technology Conference, 1998, p. 900–908.

Scrantom, *Manufacture of Embedded Integrated Passive Components into Low Temperature Co–Fired Ceramic Systems*, International Symposium on Microelectronics, 1998, p. 459–466.

Müller, *3D–Integration of Passive RF–Components in LTCC*, Technical University of Ilmenau, Germany, p. 211–216.

Wersing, *Integrated Passive Components Using Low Temperature Cofired Ceramics*, International Symposium on Microelectronics, 1998, p. 193–199.

Drüe, *RF Models of Passive LTCC Components in the Lower Gigahertz–Range*, Applied Microwave & Wireless, Technical University of Ilmenau, Germany, Apr. 1998, p. 26–35.

* cited by examiner

*Primary Examiner*—Tuyen T. Nguyen
(74) *Attorney, Agent, or Firm*—Beyer Weaver & Thomas, LLP

(57) ABSTRACT

A method for forming an embedded three-dimensional inductor is provided. Generally, a first coil winding is formed. A first dielectric layer is placed on the first coil winding. At least part of second coil winding is formed on the first dielectric layer and part of the first coil winding to create an electrical contact between the first coil winding and the second coil winding. A first tape layer with a cavity is provided, where the first coil winding, the first dielectric layer, and the second coil winding are within the cavity of the first tape layer.

11 Claims, 16 Drawing Sheets

EMBEDDED 3D COIL INDUCTORS IN A LOW TEMPERATURE, CO-FIRED CERAMIC SUBSTRATE

RELATED APPLICATIONS

This application is a continuation-in-part of U.S. application Ser. No. 09/632,361, filed on Aug. 3, 2000, now U.S. Pat. No. 6,470,545 which is a continuation-in-part of Ser. No. 09/396,151, filed Sep. 15, 1999 U.S. Pat. No. 6,252,761 issued on Jun. 26, 2001, which are incorporated by reference.

BACKGROUND OF THE INVENTION

1. Field of the Invention

The present invention relates generally to the field of inductors, and more particularly to embedded multi-layer inductors formed in a low temperature, co-fired ceramic (LTCC) substrate.

2. Description of the Related Art

Conventionally, electronic circuit components, including silicon chips, have been mounted on printed circuit boards. More recently, in order to reduce the size associated with conventional printed circuit boards, low temperature, co-fired ceramic (LTCC) substrates have been used.

A typical LTCC configuration comprises multiple layers of ceramic "tape" which are used to provide the base structure upon which to form various electronic components and electrical connections. The tape is formed from a powdered ceramic, mixed with a binder. For example, one type of ceramic tape available from Dupont is known as "Green Tape 951." The electronic components that can be formed include resistors, capacitors, inductors, and the like. The electrical connections, formed through each tape layer, are known as "vias." The components are formed by punching holes/vias in the tape as appropriate, and layering on metal, dielectrics, insulators, etc. Several layers of tape may be used in order to form the desired circuitry. The tape layers are then pressed together and fired in an oven to remove the binder and to sinter the ceramic powder. Components which are too large or too difficult to form within the ceramic tape layers, such as silicon chip capacitors, resistors, inductors, and chips, may be surface mounted on the hardened substrate. The resulting substrate is usually less than 1"×1", thus providing a compact circuit package.

FIG. 1 shows an example of the structure of a basic capacitor 10 formed within an LTCC substrate. A standard process to form this structure will now be described, with reference to FIG. 1. First, a hole is punched in a first tape layer 12 to form an opening. A silver, silver palladium, or similar paste is wiped across the hole to form a via 16, which is used as one terminal connection for the capacitor 10. Next, a first electrode 18 may be formed on top of the via 16 using silver, silver palladium or other similar electrode paste. After the electrode 18 has dried, a dielectric 20 is formed on top of the electrode 18. A dielectric paste is usually used, which when hardened, provides the desired dielectric properties. A second electrode 22 is then formed on top of the dielectric layer 20. These various component layers are commonly formed using a screen printing process. A second ceramic tape layer 14 having a via 24 is then pressed on top of the first layer 12. The second via 24 provides a second terminal for the capacitor 10. After the substrate is fired at 750–950° C., a capacitor structure 30 is formed as shown in FIG. 2. A top view of the capacitor structure 30 is shown in FIG. 3. The vias can have cross-sectional shapes of circles, squares, or rectangles.

This procedure forms what is known in the art as a single layer ceramic capacitor (SLCC), also known as a monolayer capacitor. Another embodiment of an SLCC is shown in FIG. 4. Specifically, the vias 42, 44 may be formed on the side of the electrodes 46,48, or with one via 42 in the middle of one electrode 46, and one via 44 on the side of the other electrode 48. The electrodes and dielectrics may also be formed as circles, squares or rectangles as shown in FIGS. 5(A)–5(C).

For standard capacitor configurations, the capacitance of a structure is determined according to the following formula:

$$C=(kA)/t,$$

where k is the dielectric constant of the dielectric material, A is the overlapping area between the electrodes, and t is the thickness of the dielectric, as shown in FIG. 7. Note that in FIG. 7, the dielectric area A and the electrode area A are presumed to be the same, but in practice the dielectric is usually made larger to ensure that the electrode layers do not touch. Thus, by changing the dielectric material, the capacitance value may be changed. FIG. 6 illustrates an SLCC in which a different dielectric is used, in order to change the capacitance. Instead of using a dielectric paste, the dielectric may be formed from a high firing temperature ceramic tape (1100–1400° C.). The high temperature tape 66 is fired separately, and then placed on the first electrode 72. The dielectric constant of the high temperature tape 66 is several orders of magnitude greater (k=20–20,000) than the dielectric constant of the standard tape (k=7–8) used to form the layers 62, 64. Standard tape 68,70 may be used around the dielectric to provide a constant thickness between the main layers 62, 64.

Two articles which discuss LTCC technology include "Characterization and Performance Prediction for Integral Capacitors in Low Temperature Co-Fired Ceramic Technology," Delaney et al., IEEE Transactions on Advanced Packaging, Vol. 22, No. 1, February 1999, pgs. 68–77; and "Characteristics of the Electrical Performance of Buried Capacitors and Resistors in Low Temperature Co-Fired (LTCC) Ceramic," Delaney et al., 1998 Electronic Components and Technology Conferences, pgs. 900–908, the disclosures of which are herein incorporated by reference. While these articles seek to address the problem of providing capacitors with increased capacitance, the capacitors are still confined to being formed within a single layer of ceramic tape. The disclosed processes cannot make high capacitance capacitors and they require numerous types of dielectric materials in order to create different capacitances.

Since there is a practical limit to the dielectric constant that can be achieved, single layer capacitors do not provide sufficient capacitance within a reasonable area, for many applications. Thus, for high value capacitances, external capacitors are often surface mounted on the ceramic substrate. An example of one type of capacitor 8000 used for this purpose is shown in FIG. 8. Multiple layers of electrodes are formed in a discrete ceramic capacitor, and are used in order to increase the capacitance, while still providing a relatively small component. Adding external components, however, increases the costs associated with the LTCC circuit.

The articles "Manufacture of Embedded Integrated Passive Components into Low Temperature Co-Fired Ceramic Systems," Scrantom et al., 1998 *International Symposium on Microelectronics*, 1998, pp. 459–466, "3D-Integration of Passive RF-Components in LTCC," Muller et al., and "Integrated Passive Components Using Low Temperature Cofired Ceramics," Wersing et al., 1998 *International Symposium on*

*Microelectronics*, 1998, pp. 193–199, discuss the embedding inductors in co-fired ceramics.

FIG. 18 is an end view of an LTCC planar inductor that may be used in the prior art. In this example, planar inductor 1804 is placed between a first tape layer 1808 and a second tape layer 1812. FIG. 19 is a top cross-sectional view of FIG. 18 along cut lines 19—19. The planar inductor 1804 is in a single plane, but has a serpentine or meandering shape, as shown. The serpentine shape provides a low inductance inductor in a single plane.

FIG. 20 is a side view of an LTCC three dimensional inductor that may be used in the prior art. In this example, a first ceramic tape layer 2004, a second ceramic tape layer 2008, a third ceramic tape layer 2012, and a fourth ceramic tape layer 2016 are provided. Between the first and second tape layers 2004, 2008, a first inductor ring 2020 is provided. A second inductor ring 2024 may be placed between the second and third tape layers 2008, 2012. A third inductor ring 2028 may be placed between the third and fourth tape layers 2012, 2016. The first, second, and third inductor rings 2020, 2024, 2028 are embedded and therefore are shown with broken lines. FIG. 21 is a cross-sectional view of the LTCC three-dimensional inductor shown in FIG. 20 along cut lines 21—21, which shows a cross-sectional view of the second tape layer 2008 and the second inductor ring 2024. The second inductor ring 2024 forms an almost complete ring with a first end and a second end. A first via pad 2104 is at a first end of the second inductor ring 2024. A second via pad 2108 is at a second end of the second inductor ring 2024. Similarly, the first inductor ring 2020 and the third inductor ring 2028 may have first and second ends. A first electrode 2032 may be electrically connected to the first end of the first inductor ring 2020. A first via 2036 may be electrically connected between the second end of the first inductor ring 2020 and a first via pad 2104. A second via 2040 may be electrically connected between the second via pad 2108 and the first end of the third inductor ring 2028. A second electrode 2044 may be electrically connected to the second end of the third inductor ring 2028. As can be seen in FIG. 21, the second electrode 2044 passes through the hole in the second inductor ring 2024. The resulting inductor provides about three turns over about three or four ceramic tape layers.

Higher, more compact inductors may be surface mounted on the ceramic substrate.

It would thus be desirable to have a 3-D embedded inductor that is thinner than the prior art. Such thinner inductors are more compact, taking up less landscape and may provide higher inductance.

SUMMARY OF THE INVENTION

To achieve the foregoing and other objects and in accordance with the purpose of the present invention, a variety of techniques for forming an embedded three-dimensional inductor is provided. Generally, a first coil winding is formed. A first dielectric layer is placed on the first coil winding. At least part of second coil winding is formed on the first dielectric layer and part of the first coil winding to create an electrical contact between the first coil winding and the second coil winding. A first tape layer with a cavity is provided, where the first coil winding, the first dielectric layer, and the second coil winding are within the cavity of the first tape layer.

In addition, an embedded three-dimensional inductor in a low temperature, co-fired ceramic (LTCC) substrate is provided. Generally, a tape layer with a cavity is provided. An inductor coil is within the cavity, where the inductor coil comprises a first winding and at least part of a second winding spaced vertically apart from the first winding. A dielectric layer is within the cavity between the first winding and the at least part of the second winding.

Thus, the present invention is not limited to any specific configuration or geometry of openings or vias, but the teachings encompass any structure having exposed vias connected to the edges of alternating layers of electrodes, in order to provide electrical connectivity.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an embedded 3D inductor in a low temperature, co-fired ceramic (LTCC) substrate.

Figure 1:
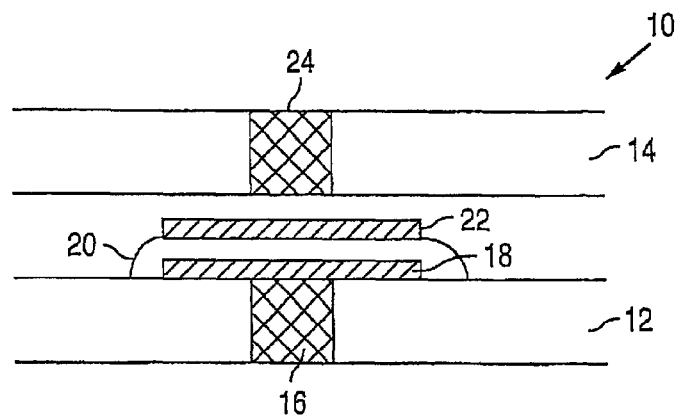
FIG. 1 is diagram of a prior art single layer ceramic capacitor (SLCC).
Figure 2:
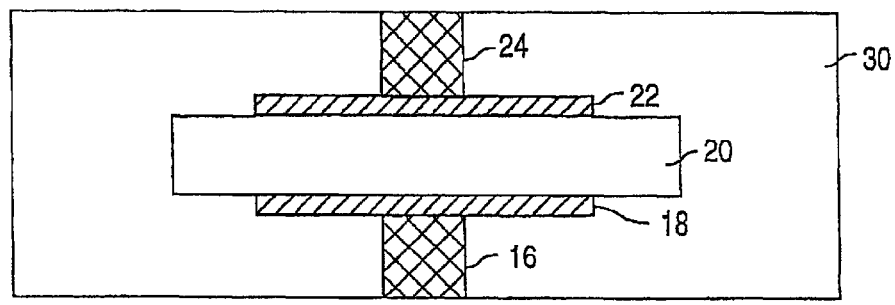
FIG. 2 is a diagram of the SLCC of FIG. 1 after the ceramic tape has been pressed and fired.
Figure 3:
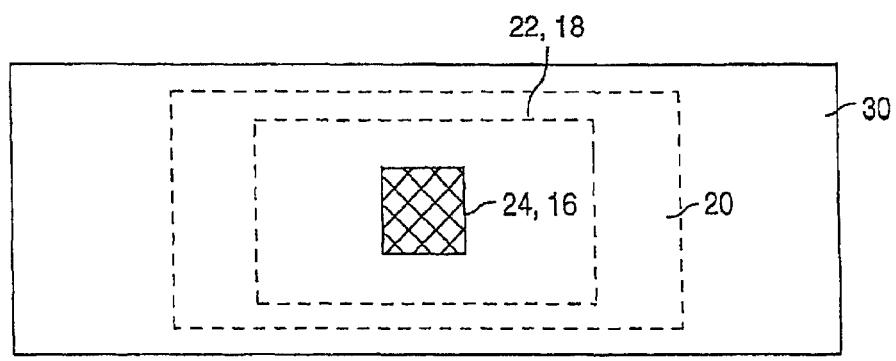
FIG. 3 is a top view of the capacitor of FIG. 2.
Figure 4:
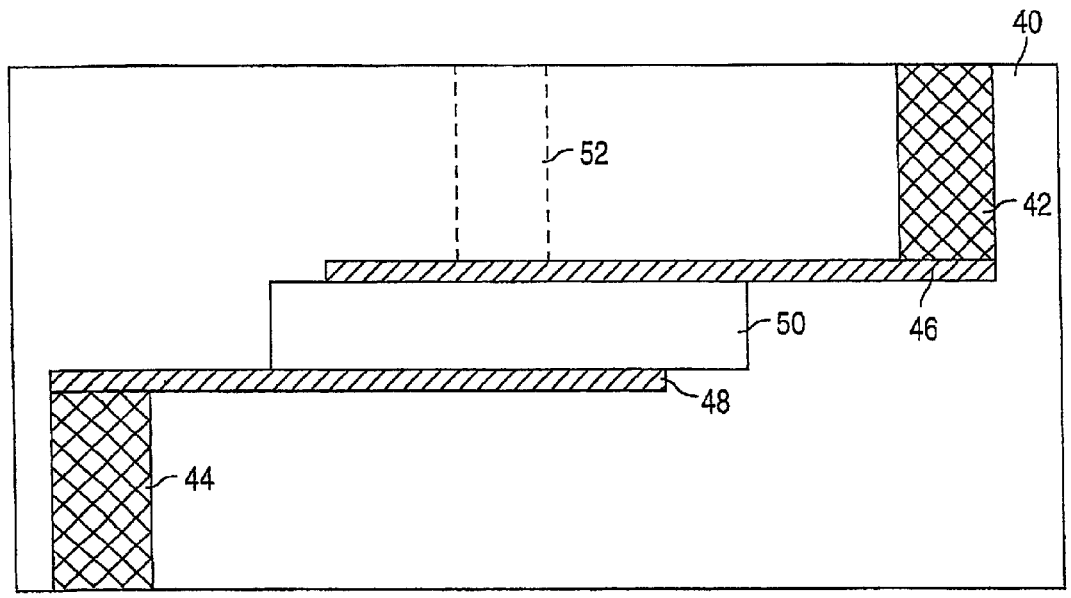
FIG. 4 is a diagram of an alternative embodiment of an SLCC according to the prior art.
Figure 5A:
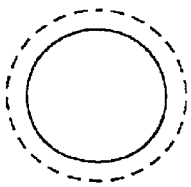
FIGS. 5(A)–5(C) are diagrams of different configurations of the electrodes and dielectric layers of an SLCC according to the prior art.
Figure 5B:
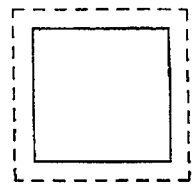
Figure 5C:
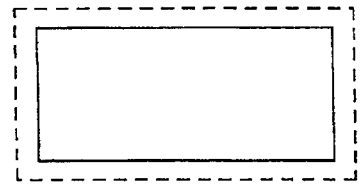
Figure 6:
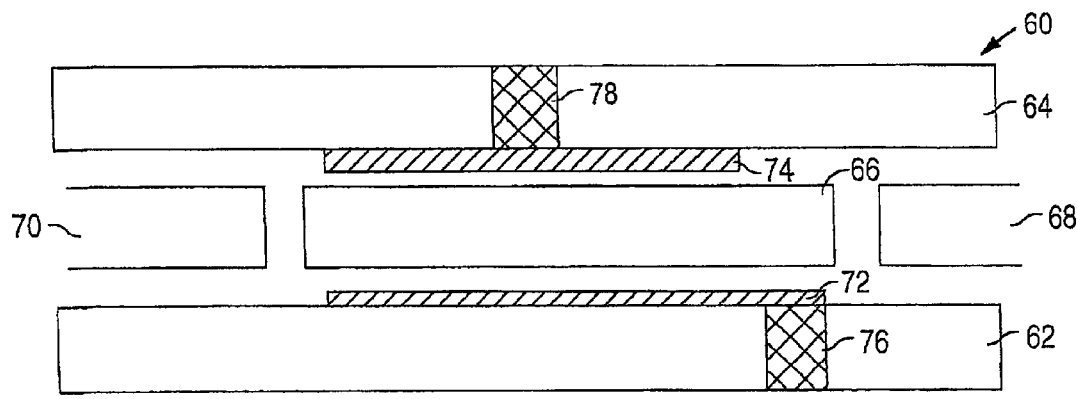
FIG. 6 is a diagram of an SLCC according to the prior art having a high temperature ceramic tape used as a dielectric.
Figure 7:
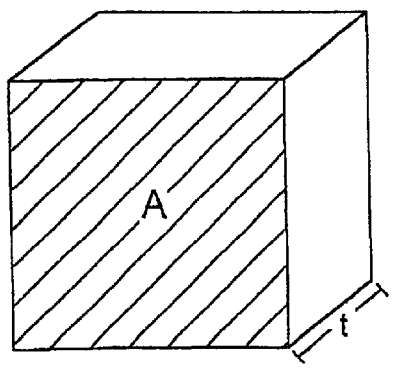
FIG. 7 is a diagram illustrating the area and thickness variables as used in the standard capacitance formula.
Figure 8:
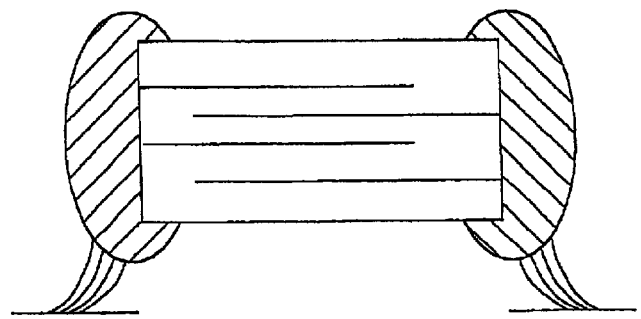
FIG. 8 is a diagram of a prior art discrete ceramic multi-layer capacitor suitable for surface mounting on an LTCC substrate.
Figure 9:
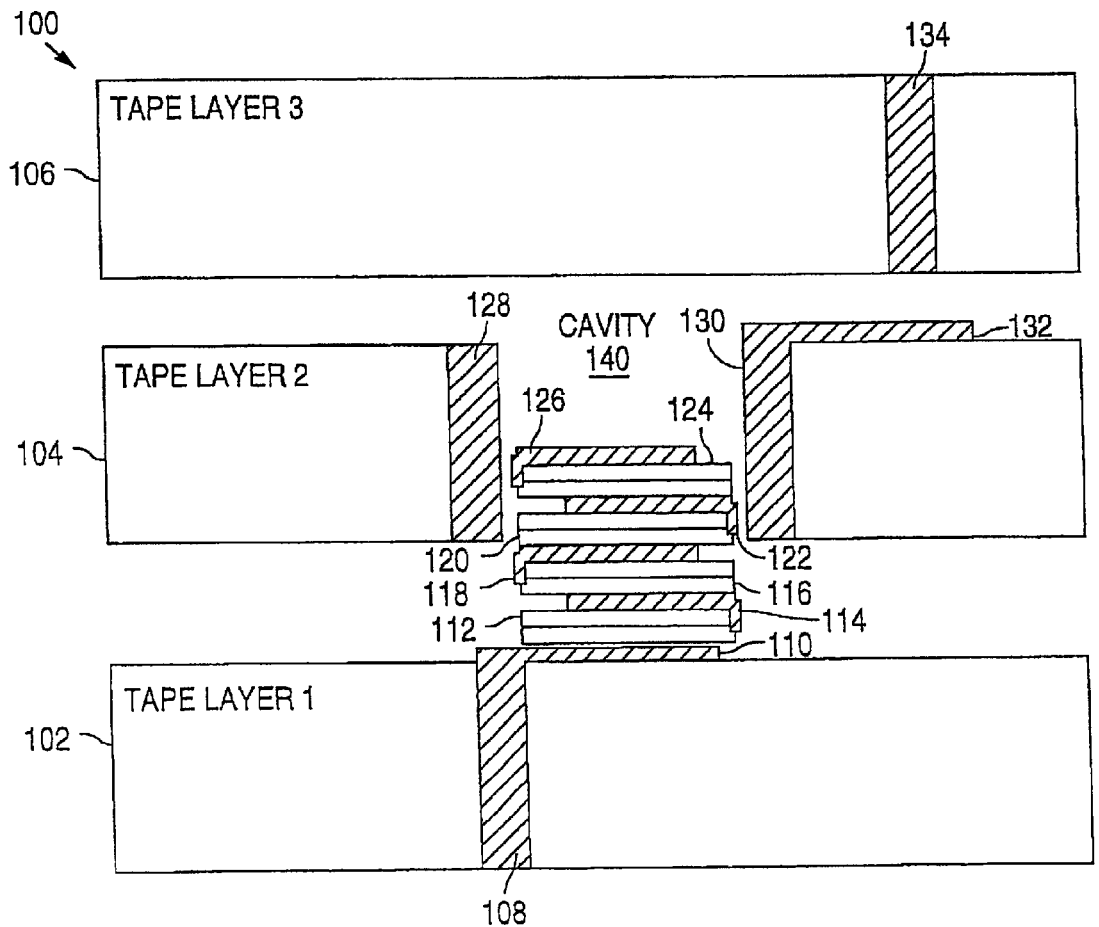
FIG. 9 is a diagram illustrating an embedded multi-layer LTCC formed according to a preferred embodiment of the present invention.
Figure 10:
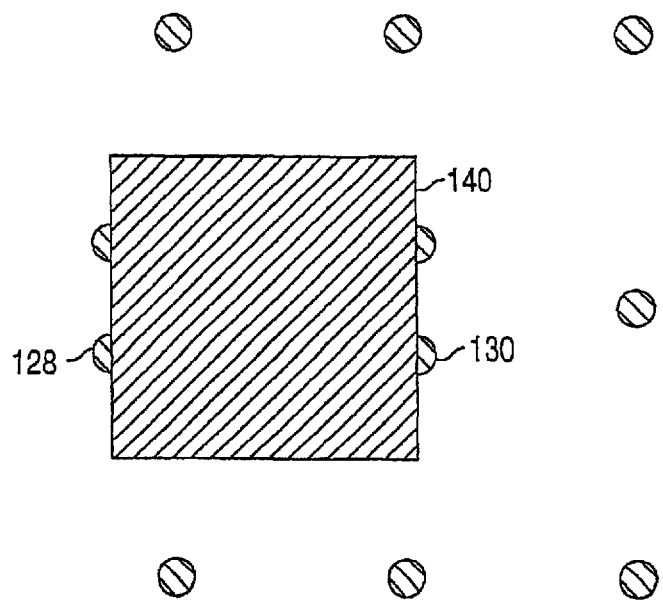
FIG. 10 is a diagram illustrating an opening in a tape layer suitable for use with the present invention.

A preferred embodiment of forming a multi-layer capacitor is illustrated in FIG. 9. An embedded multi-layer ceramic capacitor 100 is formed using three ceramic tape layers 102, 104, 106. In a standard LTCC substrate, additional layers are used to form additional circuitry. These additional layers are omitted from the discussion herein for clarity. The first tape layer 102 is formed with a via 108 in the conventional manner. The second layer 104, however, is first formed with appropriately spaced vias 128, 130, which are then punched through to expose a cross-section thereof FIG. 10 shows a top view of one embodiment of the second layer 104 that may be used for the multi-layer ceramic capacitor structure 100. Note that in FIG. 10 the cylindrical vias 128, 130 are bisected by an opening 140 created in the tape layer 104. Many other configurations are easily envisioned and are within the scope of the present invention. For example, the vias may be formed as rectangular blocks, with the opening exposing a side surface of each via, without necessarily bisecting the blocks. Also, in the preferred embodiment, two vias are bisected on each side of the opening 140, though only one via per side may be used.

The opening 140 in the second layer 104 provides a cavity in which to build the multiple electrode and dielectric layers needed to form a multi-layer capacitor. Specifically, as shown in FIG. 9, a first electrode layer 110 is formed on top of the first tape layer 102, overlapping the via 108. Alternating layers of dielectric material 112, 116, 120, 124 and electrodes 114, 118, 122, 126 are then formed on top of the first electrode layer 110. The electrode layers 114, 118, 122, 126 are formed so that each successive layer corresponds to an alternate terminal. In other words, layers 110, 118 and 126 form a first set of electrodes, which connect to the via 108 in the first tape layer 102. The remaining electrode layers 114 and 122 form a second set of electrodes, which connect to the via 134 in the third tape layer 106. The two vias 108, 134 thus correspond to the standard two terminals of a standard capacitor.

Figure 11:
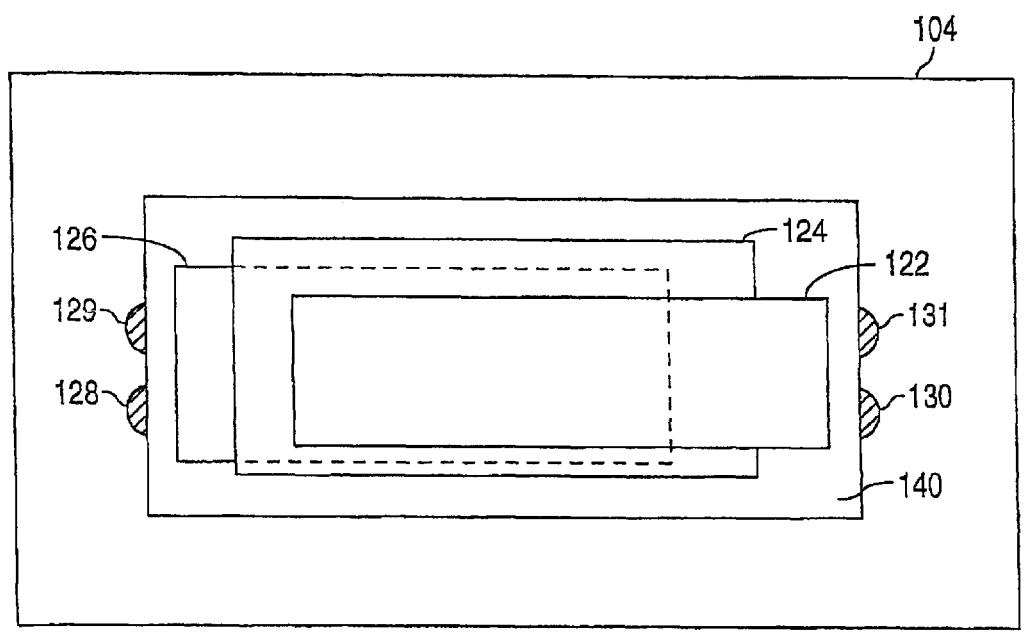
FIG. 11 is a top view of the capacitor of FIG. 9.
Figure 12:
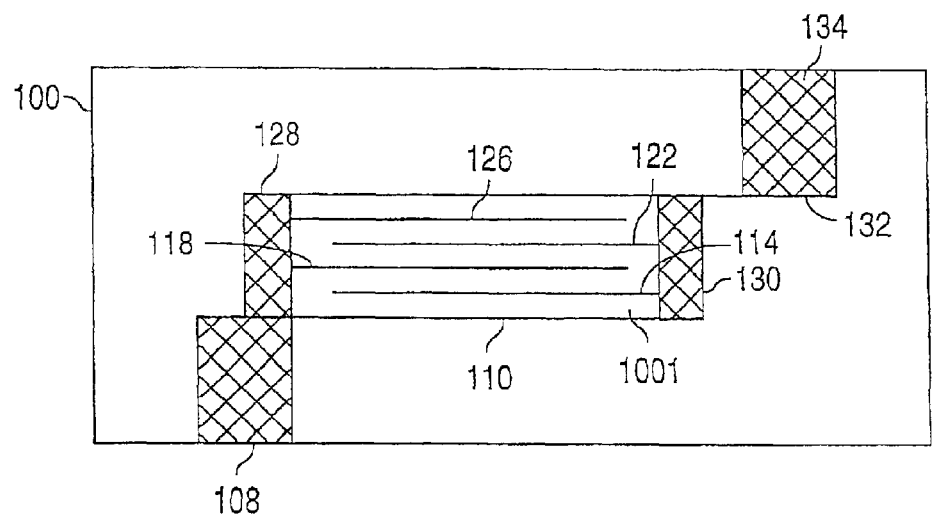
FIG. 12 is a side view of the capacitor of FIG. 9, after firing.

An individual electrode layer 114 is formed such that one end is exposed past the underlying dielectric layer 112 to connect to the adjacent exposed via 130, while the other end of the electrode 114 is formed to ensure that it does not connect to the adjacent exposed via 128. By alternating the just described electrode configuration, each electrode layer is electrically connected to an alternating exposed via. An electrical connection is formed on top of the second tape layer 104 to connect to the via 134 in the third tape layer 106. The exposed vias 128, 130 thus provide electrical connections for alternating sets of electrodes, allowing multi-layer ceramic capacitors to be formed within an LTCC substrate. When the tape layers 102, 104, 106 (and any additional LTCC layers) are pressed together and oven-fired, the silver paste (or other similar material) used to form the exposed vias 128, 130 and electrode layers 110, 114, 118, 122, 126 flows and joins together forming a permanent electrical connection. FIG. 11 illustrates a top view of the capacitor structure 100 illustrated in FIG. 9. FIG. 12 is a side view of the capacitor of FIG. 9, showing the structure after it has been pressed and fired. Notice that the dielectric material 1001 is now disposed between and around the electrodes such that the opening 140 no longer exists.

Although the preferred embodiment has been described with reference to four layers, a capacitor may be formed having greater or fewer layers. Additional tape layers may also be added between the first 102 and third 106 tape layers to provide more volume in which to build the capacitor layers. These additional tape layers are basically formed as duplicates of the second tape layer 104, with an opening punched exposing vias on the side, in which the vias provide electrical connections for the alternating layers of electrodes, and with the other tape layer(s).

Figure 16:
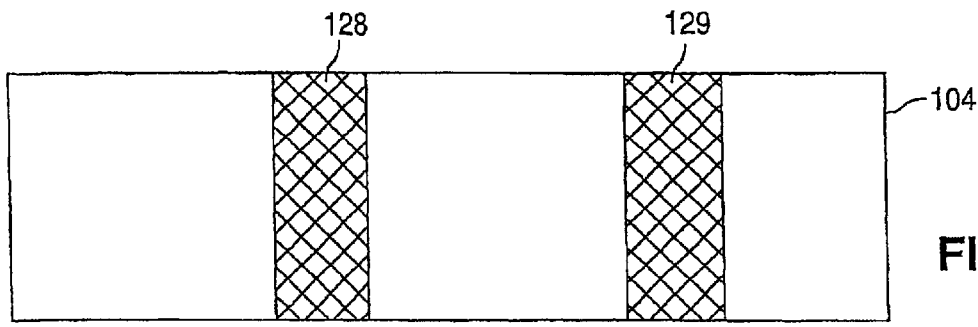
FIG. 16 is a diagram of a cross-section of a tape layer showing the bisected, exposed vias.

In the preferred embodiment, the opening 140 in the second tape layer is formed using a mechanical punch to remove the ceramic tape and expose the vias. A cross-section of one end of an opening is illustrated in FIG. 16 showing the exposed bisected vias 128, 129. Any other methods known to those skilled in the art to remove the ceramic tape may also be used. Additionally, for capacitors having many layers, a standard screen printing process may damage the structure as the layers are being built. To overcome this problem, sidewalls formed from ceramic tape may be used to facilitate the construction of the capacitor. The sidewalls are then removed before adding the second and third tape layers.

In the preferred embodiment, the dielectric layers are formed using a standard dielectric paste. There is no requirement that the same dielectric material be used for each layer, or even that the dielectric layers have the same thickness. In fact, the electrodes themselves may have different sizes, thickness, or have a different alternating pattern than those specifically described herein.

Figure 13A:
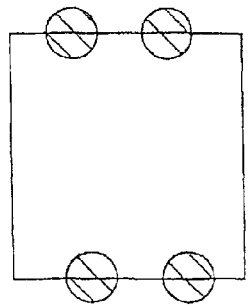
FIGS. 13(A)–13(J) illustrate top views of various alternative embodiments of the vias and openings for a capacitor according to the present invention.
Figure 13B:
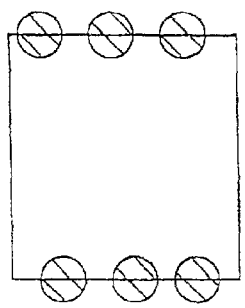
Figure 13C:

As mentioned above, in the preferred embodiment the vias in the second tape layer 104 are formed as cylinders and are bisected with a square opening 140. As shown in FIGS. 13(A)–13(J) (top views), however, numerous alternate embodiments may also be configured. Specifically, FIGS. 13(A)–13(C) illustrate that one, two or three cylindrical vias may be used on each side of the opening. FIG. 13(I) illustrates an embodiment wherein the opening is round instead of square, with the associated electrode and dielectric layers formed as circles to fit within the rounded opening. FIGS. 13(E) and 13(H) illustrate embodiments in which the vias are wider, providing greater surface area to contact the electrodes.

These embodiments illustrate that the vias are generally bisected, but more or less of the via may be removed by the punching process without departing from the scope of the present invention. In fact, in a configuration in which the vias have a flat-facing surface (as viewed from the opening), only enough of the ceramic tape needs to be removed as will expose the surface of the vias. Thus, the present invention is not limited to any specific configuration or geometry of openings or vias, but is deemed to encompass any structure having exposed vias connected to the edges of alternating layers of electrodes, in order to provide electrical connectivity.

Figure 14:
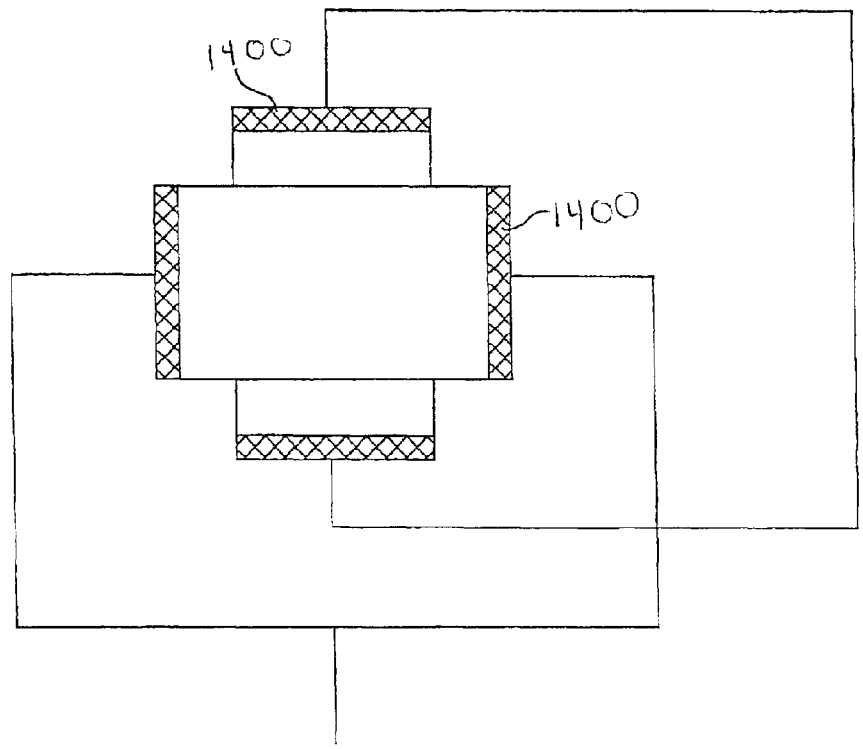
FIG. 14 is a diagram of two capacitors formed within a single opening.

FIGS. 13(D), 13(F), 13(G), and 13(J) illustrate several possible configurations for creating two different capacitors within the same opening, by using vias on each side of the opening. These configurations will now be explained further with reference to FIGS. 14 and 15. In FIG. 14, corresponding to the via structure of FIG. 13(F), two separate capacitors are formed within the same opening. By orienting the capacitors' electrodes 1400 90° to each other, the configuration provides better performance at high frequencies for certain design applications. Also, the effective surface area for one capacitor structure may be different than the area for the second structure. This allows two capacitors to be formed in a single opening, providing a significant size advantage as compared to the SLCC designs of the prior art.

Figure 13D:
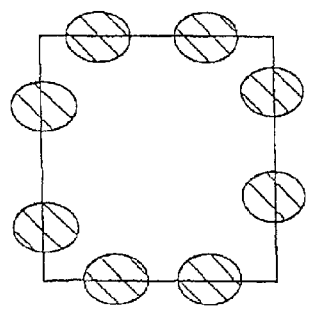
Figure 13E:
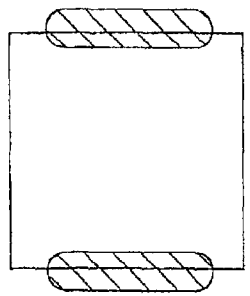
Figure 13F:
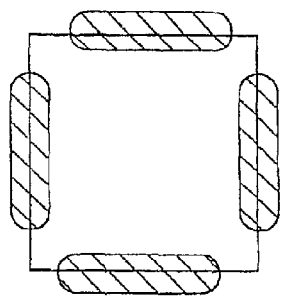
Figure 13G:
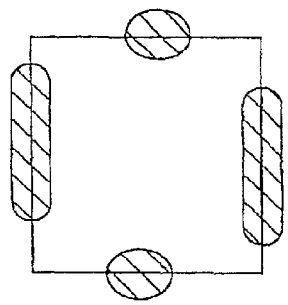
Figure 13H:
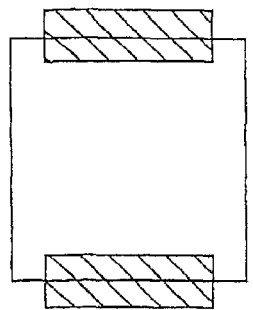
Figure 13I:
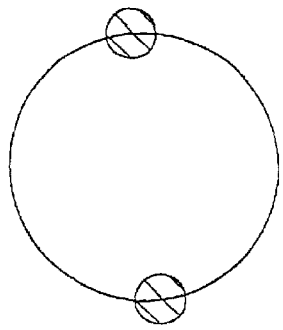
Figure 13J:
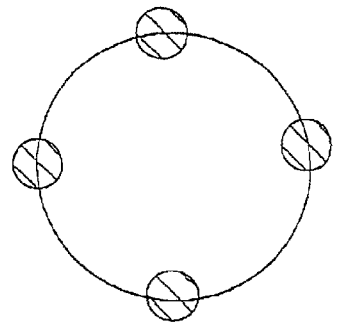
Figure 15:
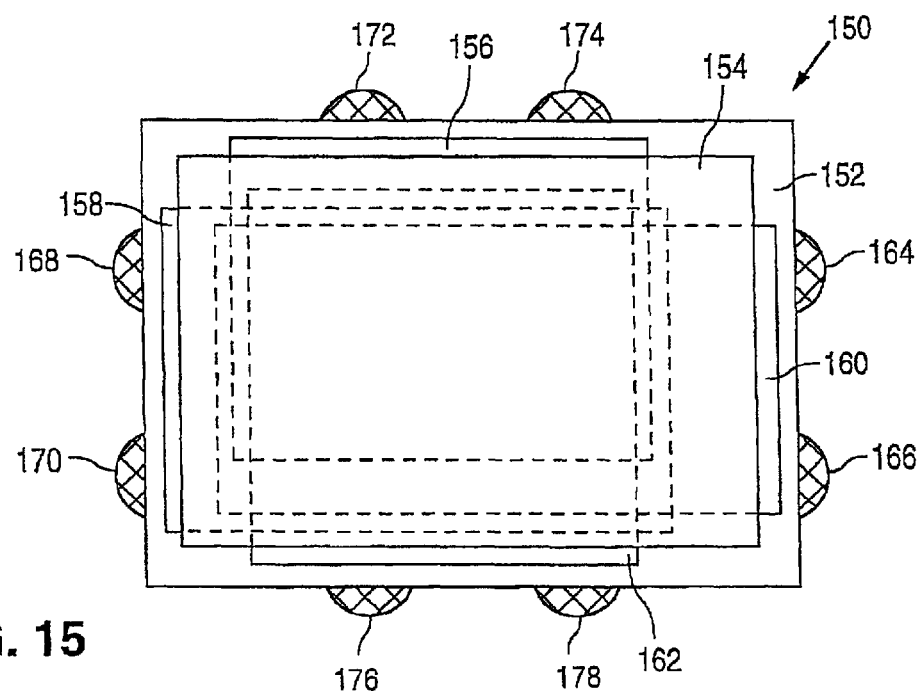
FIG. 15 is a diagram of two capacitors formed within a single opening, with each electrode having a different surface area.
Figure 17:
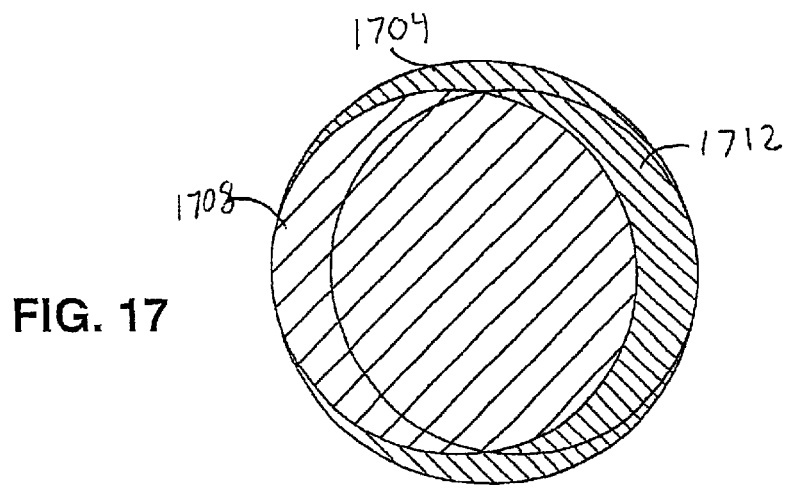
FIG. 17 is a diagram illustrating an embodiment of the present invention in which the electrodes and dielectric layers are round.
Figure 18:
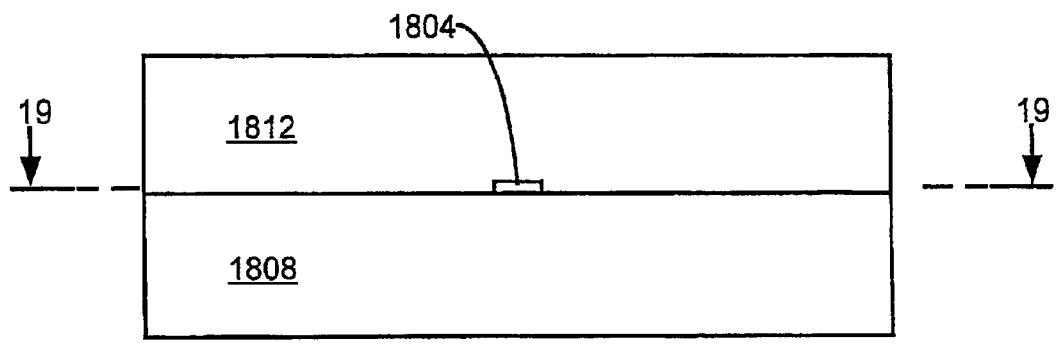
FIG. 18 is an end view of an LTCC planar inductor that may be used in the prior art.
Figure 19:
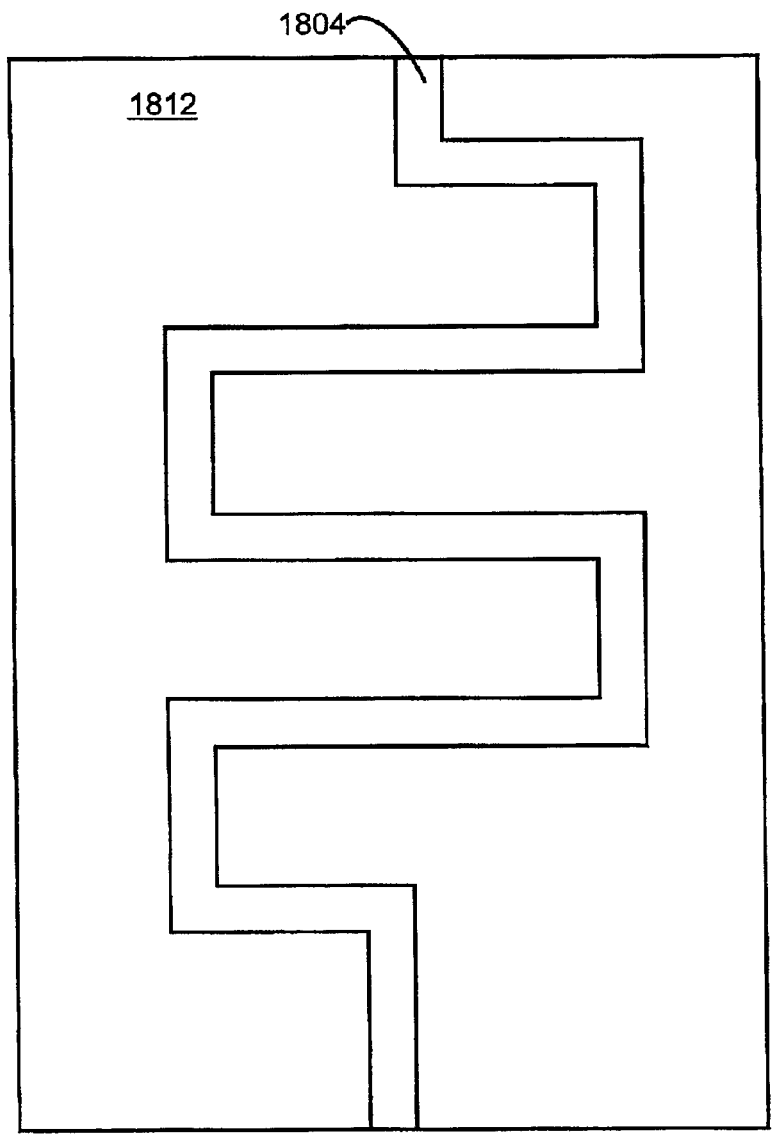
FIG. 19 is a cross-sectional view of FIG. 18 along cut lines 19—19.
Figure 20:
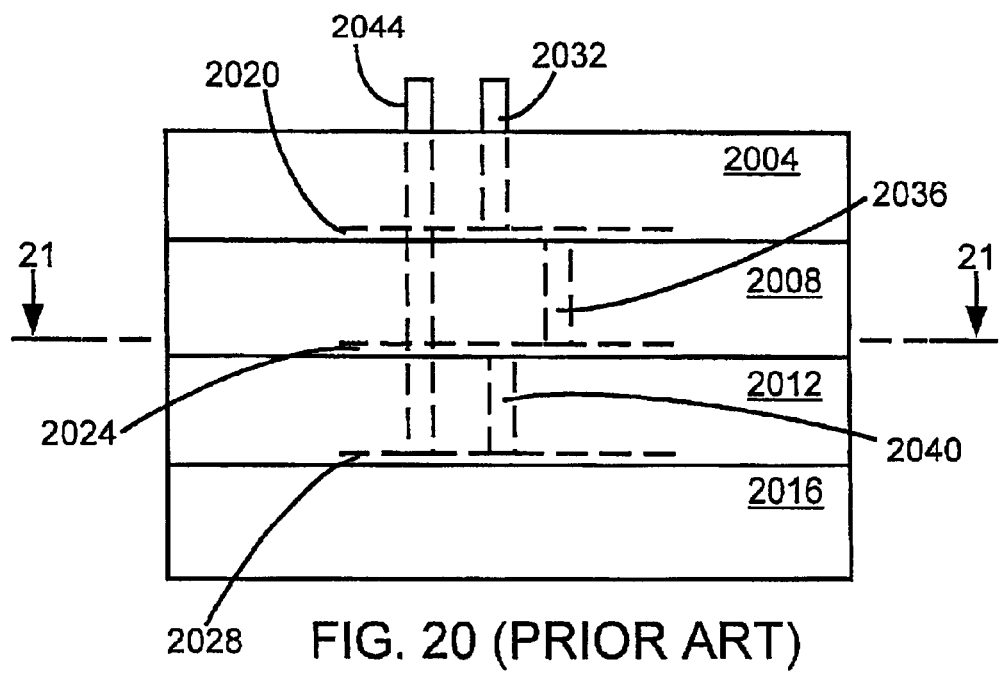
FIG. 20 is a side view of an LTCC three-dimensional inductor that may be used in the prior art.
Figure 21:
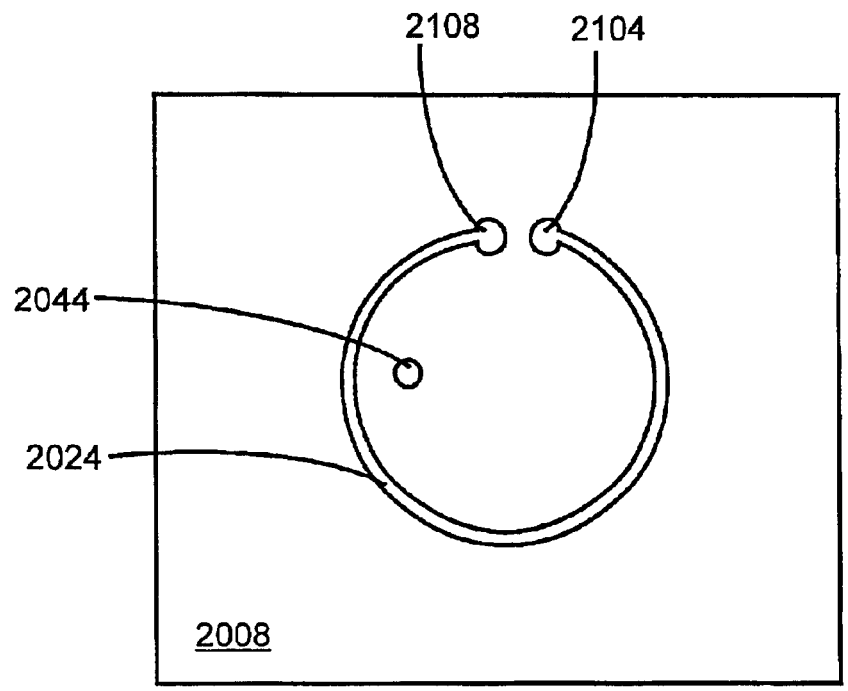
FIG. 21 is a cross-sectional view of the LTCC three-dimensional inductor shown in FIG. 20 along cut lines 21—21.

FIG. 15, corresponding to the via structure of FIG. 13(D), illustrates that four different electrode sizes may be interleaved as desired to provide two different capacitances within a single opening 152. Specifically, two sets of electrodes 156, 158 may be formed at right angles corresponding to a first capacitor. Two additional sets of electrodes 160, 162 are also formed in the same opening 152. Dielectric layers 154 are inter-spaced between the electrode layers. Each set of electrodes has a corresponding set of vias. This structure provides significant space savings over the previously utilized SLCC. Those skilled in the art will appreciate that many other configurations other than those specifically described herein may be formed utilizing the basic teachings of the present invention. For example, the electrodes and dielectrics may be shaped as necessary to fit any desired shape of opening such as a circle. A circular embodiment using a circular opening 1704, a first circular electrode 1708, and a second circular electrode 1712 is illustrated in FIG. 17.

Figure 22:
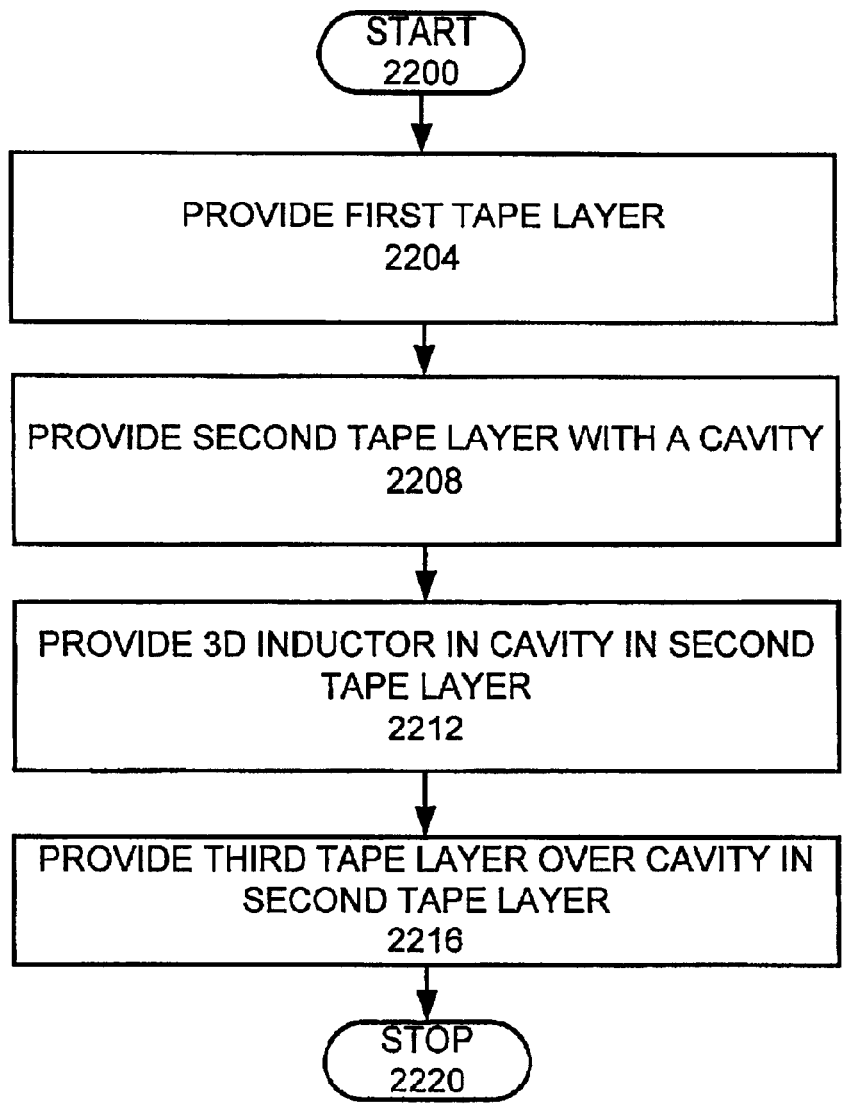
FIG. 22 is a flow chart of a method of making an inventive 3D inductor.
Figure 23:
FIG. 23 is a cross-sectional view of a first ceramic tape layer.
Figure 24:
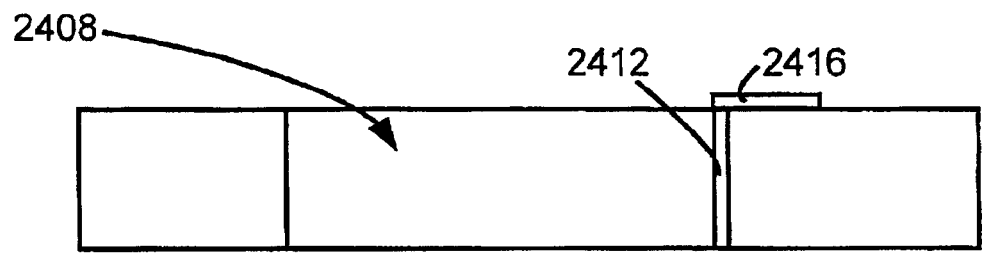
FIG. 24 is a cross-sectional view of a second tape layer with a cavity.

FIG. 22 is a flow chart of a method of making an inventive 3D inductor. A first ceramic tape layer is provided (step 2204). FIG. 23 is a cross-sectional view of a first ceramic tape layer 2304. In this embodiment, the first tape layer 2304 has a via 2308, which will be used to provide an electrical connection. A second tape layer is provided with a cavity (step 2208). FIG. 24 is a cross-sectional view of a second tape layer 2404 with a cavity 2408. The cavity 2408 is a hole, which in this embodiment passes entirely through the second tape layer 2404. An exposed via 2412 is formed on one side of the cavity. A via connector pad 2416 is placed on part of asurface of the second tape layer 2404 and is electrically connected to the exposed via 2412. A 3D inductor is provided in the cavity 2408 of the second tape (step 2212). A third tape layer may be provided over the cavity (step 2216).

Figure 26:
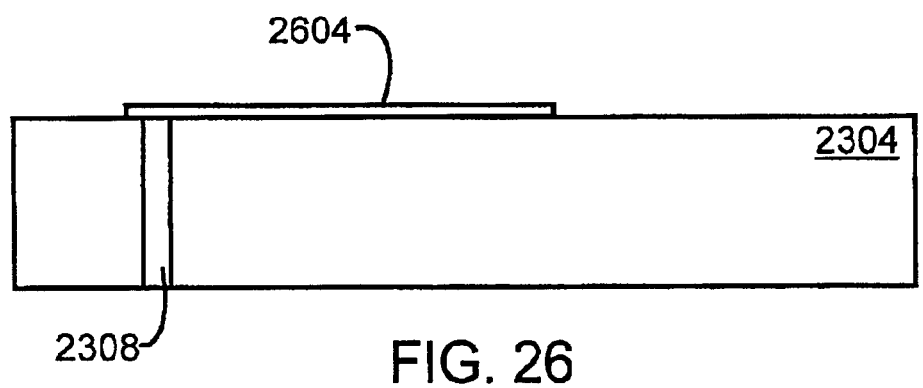
FIG. 26 is a cross-sectional view of a first part of an inductor coil printed on a first ceramic tape layer.
Figure 27:
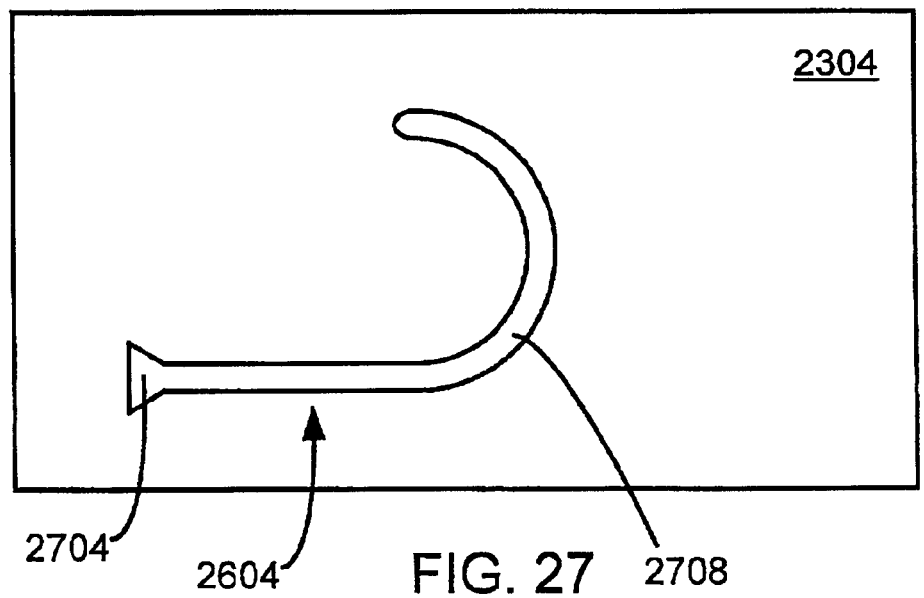
FIG. 27 is a top view of the first part of the inductor coil printed on the first ceramic tape layer.
Figure 25:
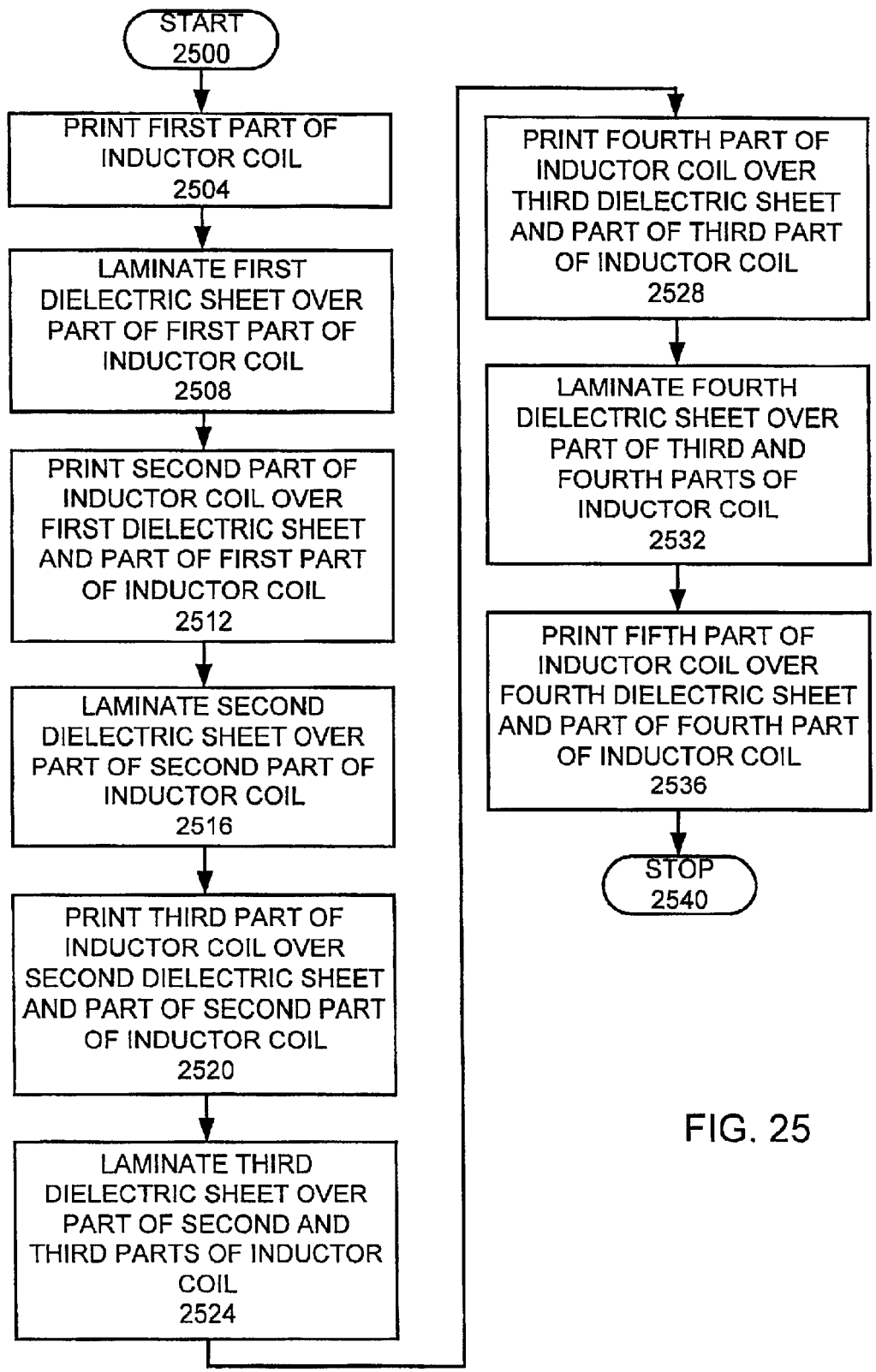
FIG. 25 is a more detailed flow chart of an embodiment of providing a 3D inductor according to the invention.
Figure 28:
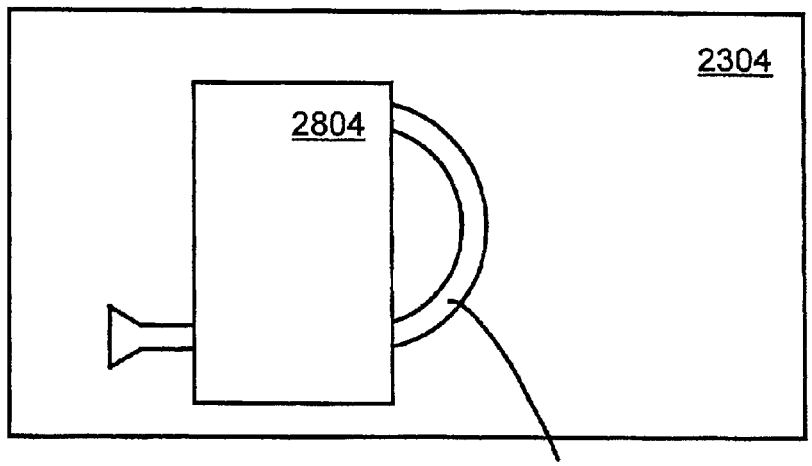
FIG. 28 is a top view of a first dielectric sheet laminated over part of the first part of the inductor coil.
Figure 29:
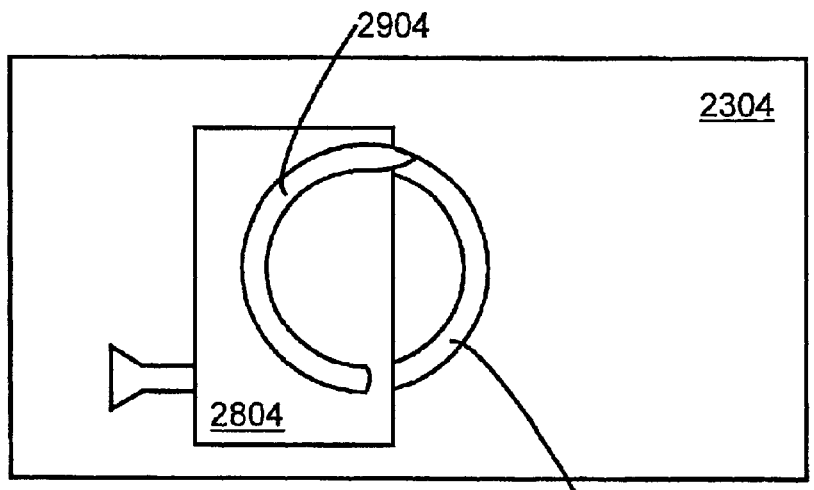
FIG. 29 is a top view of a second part of the inductor coil printed over the first dielectric sheet and the first part of the inductor coil.
Figure 30:
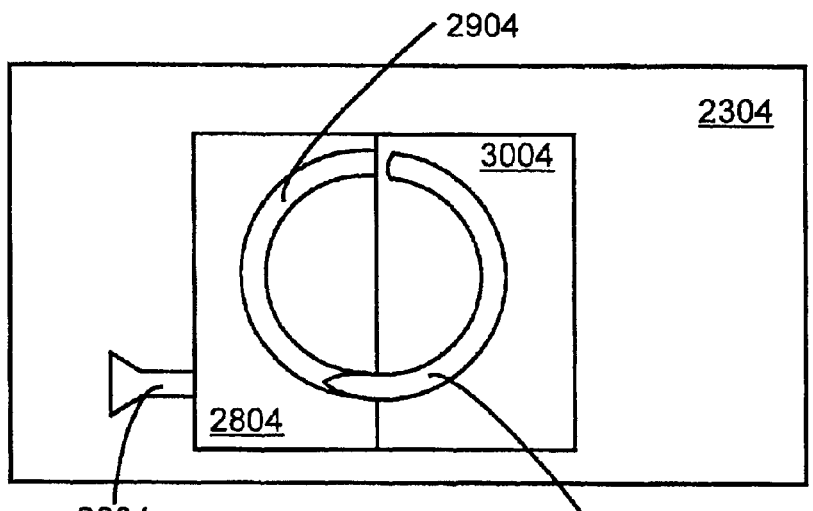
FIG. 30 is a top view of a second dielectric sheet laminated over part of the first part of the inductor coil and part of a second part of the inductor coil.
Figure 31:
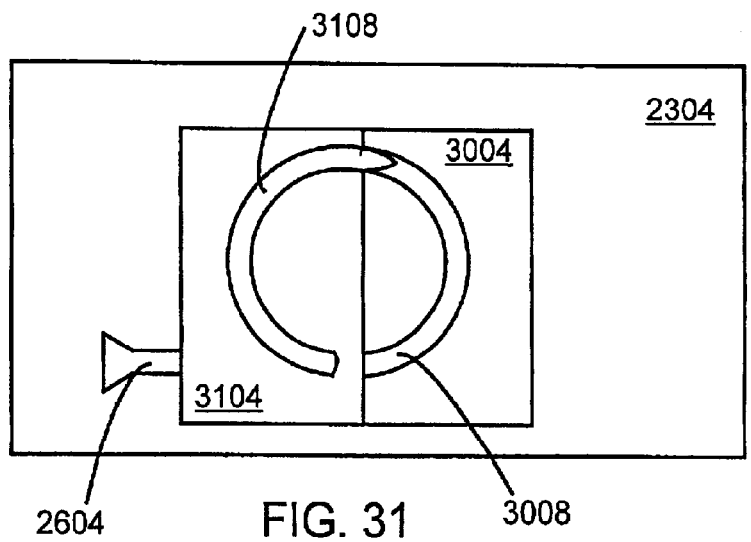
FIG. 31 is a top view of a third dielectric sheet laminated over part of a third part of the inductor coil and part of the second part of the inductor coil.
Figure 32A:
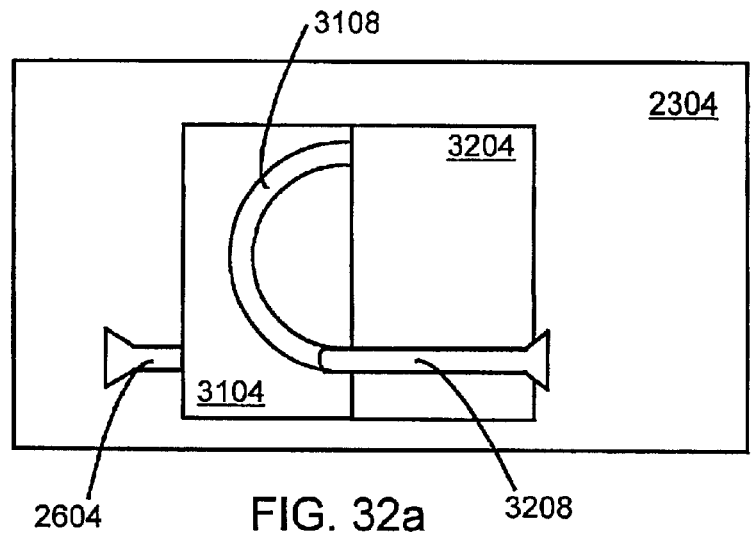
FIG. 32a is a top view of a fourth dielectric sheet laminated over part of a fourth part of the inductor coil and part of a thirdpart of the inductor coil.
Figure 32B:
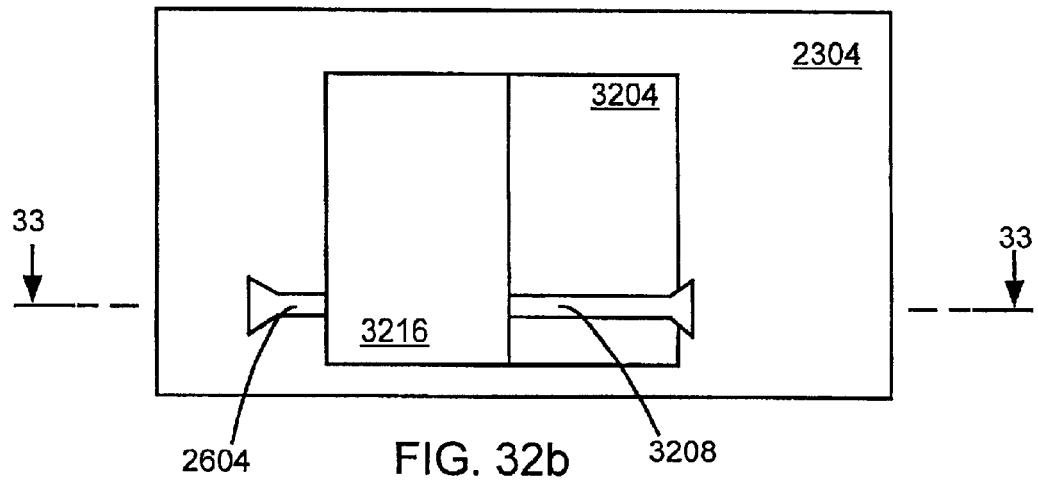
FIG. 32b is a top view of fifth dielectric sheet laminated over part of a fourth part of the inductor coil.

FIG. 25 is a more detailed flow chart of an embodiment of providing a 3D inductor according to the invention. A first part of an inductor coil is printed on the first tape layer (step 2504). FIG. 26 is a cross-sectional view of a first part of an inductor coil 2604 printed on the first ceramic tape layer 2304. FIG. 27 is a top view of the first part of the inductor coil 2604 printed on the first ceramic tape layer 2304. In this embodiment, the first part of the inductor coil 2604 forms a via pad 2704, which is electrically connected to the via 2308 in the first ceramic tape layer 2304, and part of a loop 2708 which forms part of a three-dimensional coil. A first dielectric sheet is laminated over part of the first part of the inductor coil (step 2508). FIG. 28 is a top view of a first dielectric sheet 2804 laminated over part of the first part of the inductor coil 2604. A second part of the inductor coil 2904 is printed over the first dielectric sheet and the first part of the inductor coil (step 2512), as shown in FIG. 29. The part of the second part of the inductor coil 2904 printed on part of the first part of the inductor coil 2604 forms an electrical connection between the first part of the inductor coil 2604 and the second part of the inductor coil 2904. A second dielectric sheet 3004 is laminated over part of the first part of the inductor coil 2604 and part of the second part of the inductor coil 2904 (step 2516), as shown in FIG. 30. A third part of the inductor coil 3008 is printed over the second dielectric sheet and part of the second part of the inductor coil (step 2520). A third dielectric sheet 3104 is laminated over part of the third part of the inductor coil 3008 and part of the second part of the inductor coil 2904 so that all of the second part of the inductor coil 2904 is covered, as shown in FIG. 31 (step 2524). The third dielectric sheet 3104 is also placed over the first dielectric sheet 2804. A fourth part of the inductor coil 3108 is printed over part of the third part of the inductor coil 3008 and the third dielectric sheet 3104 (step 2528). A fourth dielectric sheet 3204 is laminated over part of the fourth part of the inductor coil 3108 and part of the third part of the inductor coil 3008 so that all of the third part of the inductor coil 3008 is covered, as shown in FIG. 32a (step 2532). A fifth part of the inductor coil 3208 is printed over part of the fourth part of the inductor coil 3108 and the fourth dielectric sheet 3204 (step 2536). A fifth dielectric sheet 3216 is laminated over part of the fourth part of the inductor coil 3108, so that all of the fourth part of the inductor coil 3108 is covered, as shown in FIG. 32b.

Figure 33:
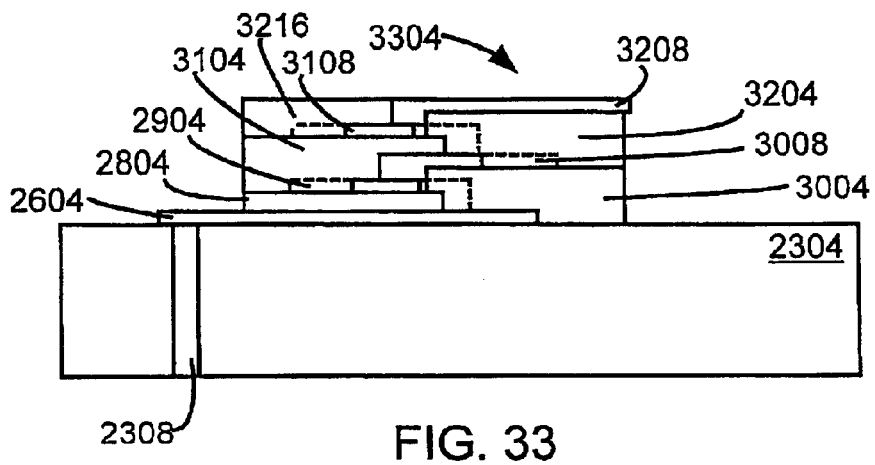
FIG. 33 is a schematic illustration of a cross-sectional view of FIG. 32b, along cut lines 33—33.
Figure 34:
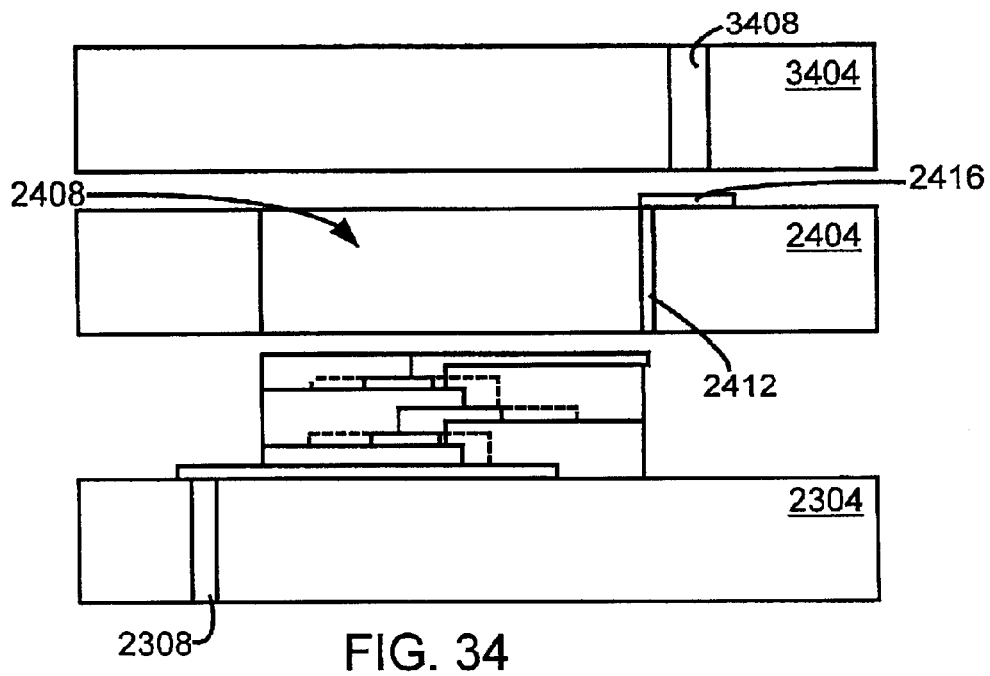
FIG. 34 is an exploded cross-sectional view of the first tape layer with an inductor formed thereon, the second tape layer with the cavity, and a third tape layer with a via.
Figure 35:
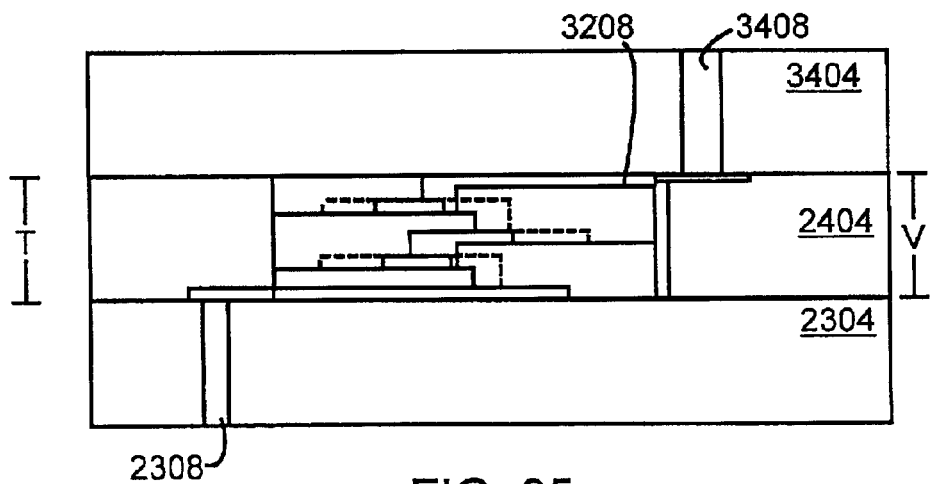
FIG. 35 is a cross-sectional view of the assembled first tape layer with an inductor formed thereon, the second tape layer with the cavity, and a third tape layer with a via.

FIG. 33 is a schematic illustration of a cross-sectional view of FIG. 32, along cut lines 33—33. The resulting three-dimensional LTCC inductor 3304 is formed on the first tape layer 2304. FIG. 34 is an exploded cross-sectional view of the first tape layer 2304 with the inductor 3304 formed thereon, the second tape layer 2404 with the cavity 2408, and a third tape layer 3404 with a via 3408. The second tape layer 2404 is placed on top of the first tape layer 2304 so that the inductor 3304 is in the cavity 2408 (step 2212), as shown in FIG. 35. The third tape layer 3404 is placed on top of the second tape layer 2404, so that the third tape layer 3404 covers the cavity 2408 in the second tape layer 2404 (step 2216). The via 3408 in the third tape layer 3404 makes electrical contact with the fifth part of the inductor coil 3208. The first, second, and third tape layers 2304, 2404, 3404, and the inductor 3304 may all be fired together as part of the LTCC. A judicious selection of materials allows these components to shrink in about the same proportions.

Printing may be by any method that provides a layer of a conductive material on a substrate, such as a screen printing process. Laminating may be any method that provides a sheet, such as a layer of a dielectric material on a substrate. The laminating of a dielectric sheet may be accomplished by placing a sheet of dielectric paste over part of the inductor-coil or by printing the dielectric material over part of the inductor coil. There is no requirement that the same dielectric material be used for each layer, or even that the dielectric layers have the same thickness.

In this embodiment, the first part 2604 and the second part 2904 of the inductor coil form a first coil winding. The third inductor part 3008 and the fourth inductor part 3108 form a second coil winding. The first, second, third, and fourth dielectric sheets 2804, 3004, 3104, 3204 provide an electrical insulation and separation between coil windings. The second and third dielectric sheets form a dielectric layer that separates the first coil winding from the second coil winding. The dielectric layer has about the same thickness as the dielectric sheets which form it, so that the second ceramic tape layer is several times the thickness of the dielectric layer. The fifth inductor part 3208 may form part of a third coil winding, with the fourth dielectric sheet 3204 forming a second dielectric layer which separates the second coil winding from the part of the third coil winding. The first coil winding and the second coil winding are vertically displaced along a direction "V", which is generally along the thickness "T" of the second tape layer 2404, as shown in FIG. 35. In this embodiment, the second coil winding has the same shape and location as the first coil winding, except that the second coil winding is vertically displaced from the first coil winding, so that both the first coil winding and the second coil winding have centers that form a vertical line. Generally, the inductor coil comprises a first winding and at least part of a second winding, where part of the second winding overlaps the first winding and where a dielectric layer is used to provide insulation between the first winding and the second winding. The cavity may only be partly through the thickness of the second tape layer.

Figure 36:
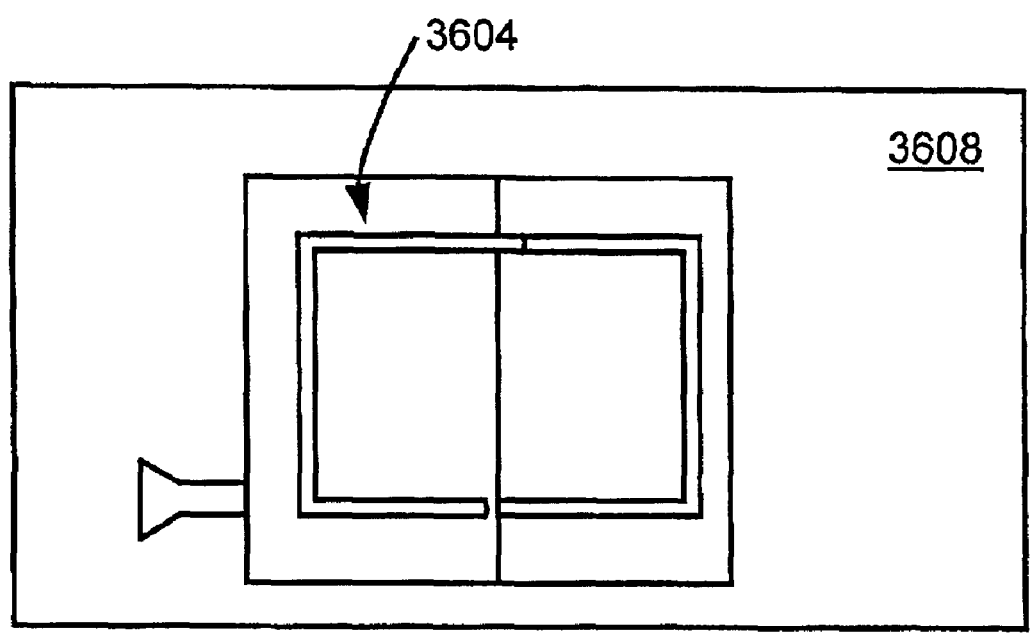
FIG. 36 is a top view of part of an incomplete rectangular shaped inductor coil on a first tape layer.

In other embodiments, other numbers of turns may be used to form the inductor coil. Fractions of turns may be used. Other shapes of the inductor coil may also be used. For example, the inductor coil may have a square shape, a rectangular shape, or an oval shape. FIG. 36 is a top view of part of an incomplete rectangular shaped inductor coil 3604 on a first tape layer 3608. Different via configurations in ceramic tape layers may be used to provide electrical connections to the inductor. Other embodiments may use segmented dielectric sheets, where a single dielectric sheet may comprise one or more separate dielectric sheets, which may be spaced apart, adjacent to each other, or may overlap each other. In addition, each part of the inductor coil may comprise smaller parts that are printed separately.

Those skilled in the art will appreciate that various adaptations, modifications, permutations, and substitute equivalents of the just-described preferred embodiments can be configured without departing from the scope and spirit of the invention. The present invention, in general, is an apparatus and method for forming a three-dimensional inductor in an LTCC substrate. Therefore, it is to be understood that, within the scope of the appended claims, the invention may be practiced other than as specifically described herein.

What is claimed is:

1. An embedded three-dimensional inductor in a low temperature, co-fired ceramic (LTCC) substrate, the inductor comprising:
   a tape layer with a cavity;
   an inductor coil within the cavity, wherein the inductor coil comprises:
      a first winding; and
      at least part of a second winding spaced vertically apart from the first winding,
   wherein part of the at least part of the second winding is printed on part of the first winding to form an electrical connection between the first winding and the second winding, wherein the at least part of the second winding is a complete second winding;
   a dielectric layer within the cavity between the first winding and the at least part of the second winding, wherein the at least part of the second winding is printed on the dielectric layer;
   a third winding in the cavity vertically spaced from the second winding; and
   a second dielectric layer within the cavity separating the second winding from the third winding, wherein the third winding is printed on the second dielectric layer and where at least part of the third winding is printed on at least part of the second winding to create an electrical connection between the third winding and the second winding.

2. The embedded three-dimensional inductor, as recited in claim 1, wherein the second dielectric layer comprises at least two separate dielectric sheets.

3. The embedded three-dimensional inductor, as recited in claim 2, further comprising a second tape layer, which covers the cavity.

4. The embedded three-dimensional inductor, as recited in claim 3, further comprising a via in the second tape layer, wherein the via is electrically connected to the first coil winding.

5. The embedded three-dimensional inductor, as recited in claim 4, wherein the second coil winding has a same shape and location as the first coil winding, being only displaced vertically with respect to the first coil winding.

6. The embedded three-dimensional inductor, as recited in claim 1, further comprising a second tape layer, which covers the cavity.

7. The embedded three-dimensional inductor, as recited in claim 6, further comprising a via in the second tape layer, wherein the via is electrically connected to the first coil winding.

8. The embedded three-dimensional inductor, as recited in claim 1, wherein the tape layer is several times thicker than the dielectric layer.

9. The embedded three-dimensional inductor, as recited in claim 8, wherein the vertical direction is along a thickness of the tape layer.

10. The embedded three-dimensional inductor, as recited in claim 9, wherein the three-dimensional inductor forms a three-dimensional coil.

11. The embedded three-dimensional inductor, as recited in claim 1, wherein the three-dimensional inductor forms a three-dimensional coil.

* * * * *

UNITED STATES PATENT AND TRADEMARK OFFICE
CERTIFICATE OF CORRECTION

PATENT NO. : 6,778,058 B1  Page 1 of 1
DATED : August 17, 2004
INVENTOR(S) : Shaul Branchevsky It is certified that error appears in the above-identified patent and that said Letters Patent is hereby corrected as shown below:

<u>Column 2,</u>
Line 41, change "Technology Conferences" to -- Technology Conference --.

Signed and Sealed this

Seventh Day of December, 2004

JON W. DUDAS
*Director of the United States Patent and Trademark Office*